United States Patent
Bridges

(10) Patent No.: US 11,272,644 B2
(45) Date of Patent: Mar. 8, 2022

(54) GRILL FOR FACILITATING AIR FLOW

(71) Applicant: Eaton Corporation, Cleveland, OH (US)

(72) Inventor: Christopher Harris Bridges, Saluda, SC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 431 days.

(21) Appl. No.: 15/880,839

(22) Filed: Jan. 26, 2018

(65) Prior Publication Data

US 2018/0220556 A1 Aug. 2, 2018

Related U.S. Application Data

(60) Provisional application No. 62/453,587, filed on Feb. 2, 2017.

(51) Int. Cl.
*H05K 7/20* (2006.01)
*H05K 5/02* (2006.01)

(52) U.S. Cl.
CPC ....... *H05K 7/20909* (2013.01); *H05K 5/0213* (2013.01); *H05K 7/20181* (2013.01)

(58) Field of Classification Search
CPC ........... H05K 7/20909; H05K 7/20181; H05K 9/0041; F24F 13/082; F24F 7/013; F24F 13/068; F24F 13/18; F24F 2013/088
USPC ....... 454/184; D23/397, 400, 406, 335, 354, D23/358, 363, 381, 388, 389, 390, 391, D23/392, 245, 275–285
See application file for complete search history.

(56) References Cited

U.S. PATENT DOCUMENTS

| | | | |
|---|---|---|---|
| 5,928,076 A * | 7/1999 | Clements | H05K 9/0041 454/184 |
| D738,485 S * | 9/2015 | Carroll | D23/388 |
| 2007/0247811 A1* | 10/2007 | Ohmi | H05K 7/20909 361/697 |
| 2009/0290293 A1* | 11/2009 | Wang | G06F 1/26 361/601 |
| 2010/0233952 A1* | 9/2010 | Mavroudis | F24F 13/082 454/275 |

OTHER PUBLICATIONS

230 Pinwheel Perforated Grille, Architectural Grille, https://web.archive.org/web/20150323021106/https://www.archgrille.com/collections/perforated-grilles/products/230-pinwheel-perforated-grille (Year: 2015).*

* cited by examiner

*Primary Examiner* — Steven B McAllister
*Assistant Examiner* — Charles R Brawner
(74) *Attorney, Agent, or Firm* — Squire Patton Boggs (US) LLP

(57) ABSTRACT

A system includes an enclosure having at least one panel with a grill disposed thereon. The grill includes a plurality of rounded, elongated openings, with each elongated opening having a pair of rounded ends connected by a curved middle portion. Each of the pair of rounded ends is defined by a first radius. The system further includes electrical equipment housed in the enclosure and at least one fan configured to force air over the electrical equipment and out the grill of the at least one panel.

16 Claims, 5 Drawing Sheets

GRILL FOR FACILITATING AIR FLOW

FIELD OF INVENTION

The present disclosure relates to a grill for facilitating air flow. More particularly, the present disclosure relates to a grill on an enclosure that houses electrical equipment and a forced air cooling system.

BACKGROUND

Enclosures are used in the power distribution industry to house electrical equipment, such as transformers, circuit boards, circuit breakers, switches, or other known electrical equipment. To prevent the equipment from overheating, one or more fans may be employed to force air across the components. The enclosures include a grill (i.e., openings) on one or more panels or doors to allow the air to vent and thus draw heat out of the system. In some instances, it may be desirable for electrical equipment and its enclosure to be built to meet the thermal requirements of an industry standard. For example, IEEE C37.20.2 includes thermal standards for metal-clad medium voltage switchgears.

Some enclosures are known to have doors or panels with grills having rectangular openings. Increasing the number of openings will increase the cooling efficiency of the system. However, increasing the number of openings may also weaken the door or panel. Additionally, increasing the number of openings reduces the available area on the panel or door to attach other components (such as labels, handles, or electronic devices).

SUMMARY

A system includes an enclosure having at least one panel with a grill disposed thereon. The grill includes a plurality of rounded, elongated openings, with each elongated opening having a pair of convex rounded ends connected by a concave middle portion. Each of the pair of convex rounded ends is defined by a first radius and the concave middle portion is defined by a second radius. The system further includes electrical equipment housed in the enclosure and at least one fan configured to force air over the electrical equipment and out the grill of the at least one panel.

BRIEF DESCRIPTION OF DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
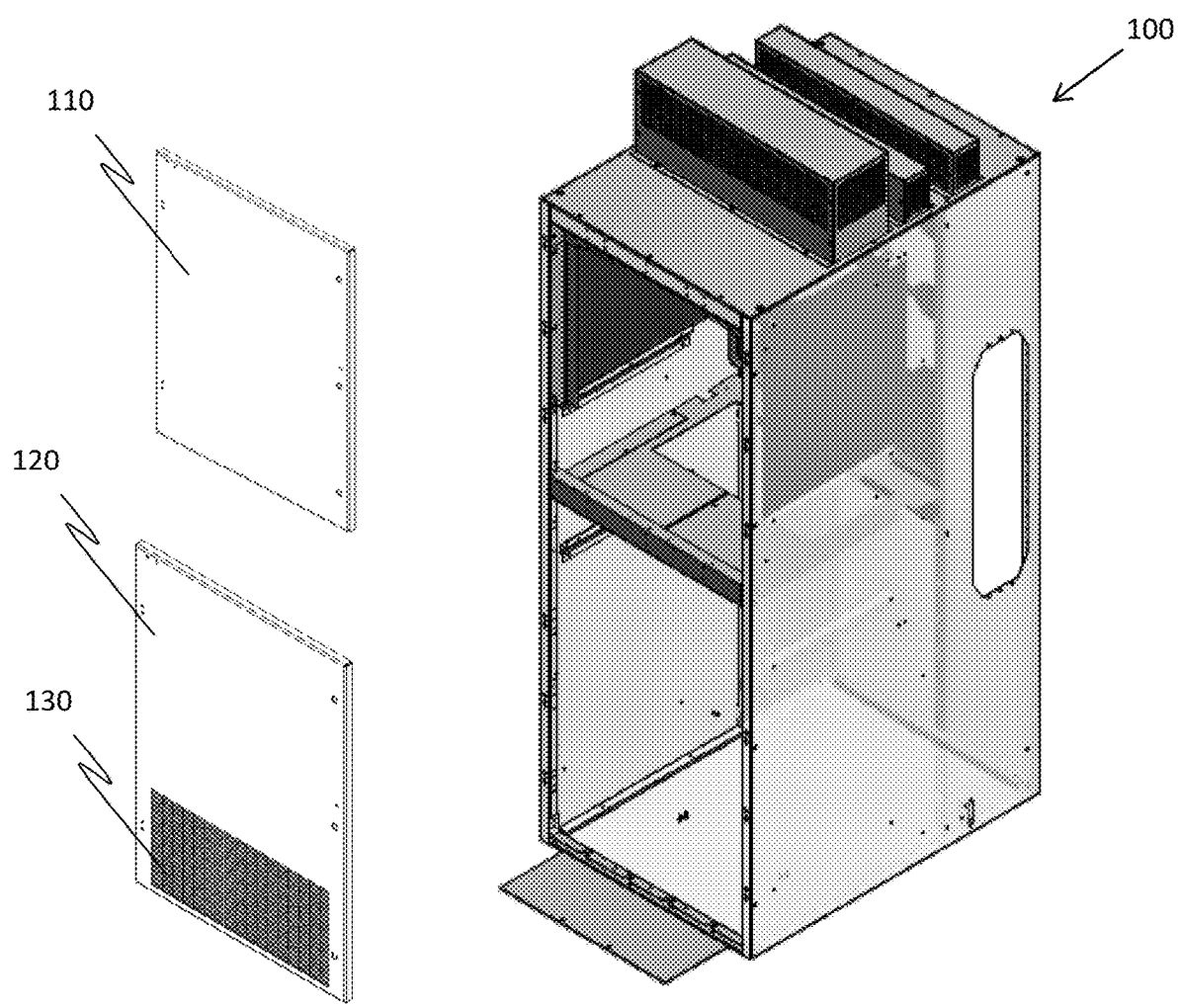
FIG. 1 illustrates an exploded, perspective view of an exemplary enclosure for electrical equipment.

FIG. 1 is an exploded, perspective view of an exemplary enclosure 100 for electrical equipment (not shown). In the illustrated embodiment, the enclosure is cuboid shaped. In alternative embodiments (not shown), the enclosure may have any polyhedron shape. Alternatively, the enclosure may be cylindrical or irregularly shaped.

In one embodiment, the enclosure is constructed of steel, such as 11-gauge steel. In an alternative embodiment, the enclosure may be constructed of aluminum or another metal. In another alternative embodiment, the enclosure may be constructed of a polymeric material.

The enclosure 100 may house electrical equipment 105 such as transformers, circuit boards, circuit breakers, switches, or other known electrical equipment. In one known embodiment, an enclosure is part of a medium voltage switchgear. However, the enclosure described herein may be employed for any electrical equipment, including commercial, industrial, and consumer products.

Figure 4:
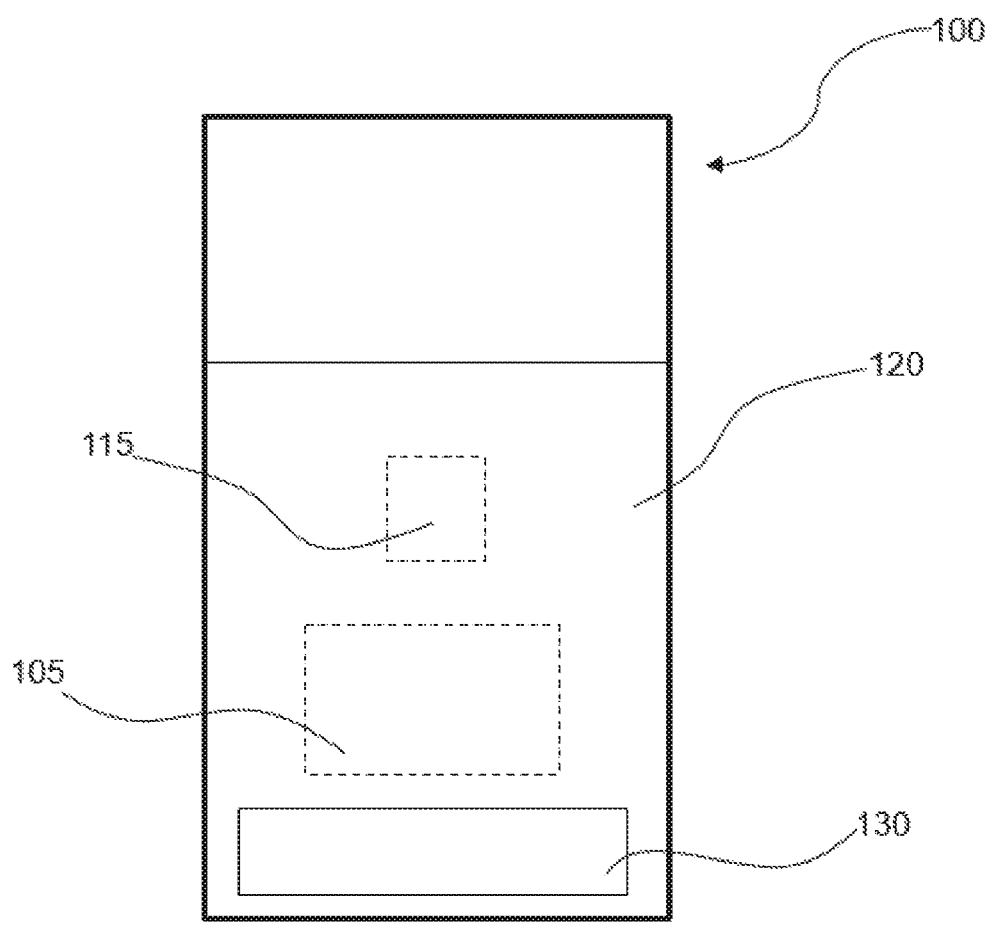
FIG. 4 is a schematic illustration of the enclosure of FIG. 1.

In one embodiment, the enclosure 100 also houses at least one fan or blower 115 as shown in the schematic illustration of FIG. 4. Multiple fans may be employed as needed to force air across, and thus cool, the electrical equipment. Redundant or backup fans may also be employed to prevent failure. In some embodiments, the fans produce an airflow between 200 and 1100 cubic feet per minute (CFM). In other known embodiments, the fans produce an airflow of less than 200 CFM. In one known embodiment, a KOOLTRONIC KBB60-60 fan is employed. This fan 115 operates at 110 volts to turn at a nominal rate of 1575 RPM and produce an airflow of approximately 665 CFM.

In the illustrated embodiment, one side of the enclosure 100 is formed by an upper panel 110 and a lower panel 120. Here, the upper panel 110 is a solid panel and the lower panel 120 includes a grill 130. The grill 130 includes a plurality of openings that allow the forced air from the fans to vent out of the enclosure 100, thus removing heat from the enclosure. While two separate panels are shown in the illustrated embodiment, a single panel may be employed instead. In alternative embodiments, grills are disposed on multiple panels. The grill may be disposed on a stationary panel, a hinged door, or a removable panel.

Figure 2:
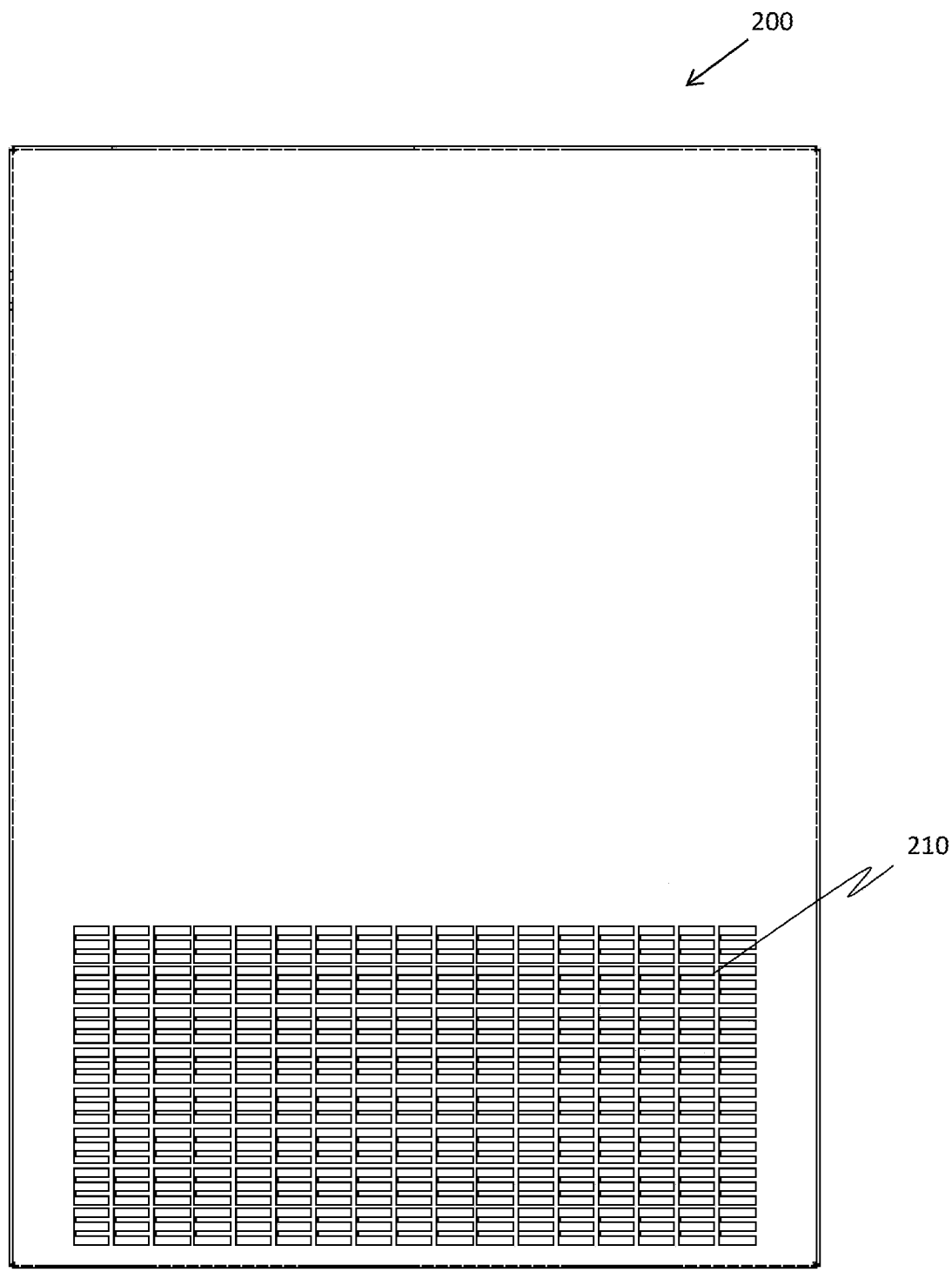
FIG. 2 illustrates a front view of a prior art panel for an enclosure.

FIG. 2 illustrates a front view of a prior art panel 200 for an enclosure. The panel 200 is similar to those shown in the enclosure 100 of FIG. 1. The panel 200 has a solid upper portion, and a grill 210 disposed in a lower portion. The grill 210 includes a plurality of rectangular openings.

In the illustrated embodiment, the grill 210 accounts for about 13.5% of the surface area of the panel 200. In one known embodiment, each rectangular opening has a length of 1.48 inches and a height of 0.36 inches. The openings are spaced apart horizontally by a distance of 0.20 inches and are also spaced apart vertically by a distance of 0.20 inches.

The grill 210 may be insufficient to vent the airflow needed for certain applications. It is therefore desirable for a panel to have a large grill area with many large openings to allow forced air to vent from the enclosure at a rate sufficient to maintain the fans and the electrical equipment at an operating temperature. However, it is also desirable for a significant portion of a panel to be solid, to allow components such as labels, handles, or electronic devices to be attached to the panel. It is also desirable for a significant portion of the panel to be solid, to provide sufficient structural integrity for the enclosure.

Figure 3:
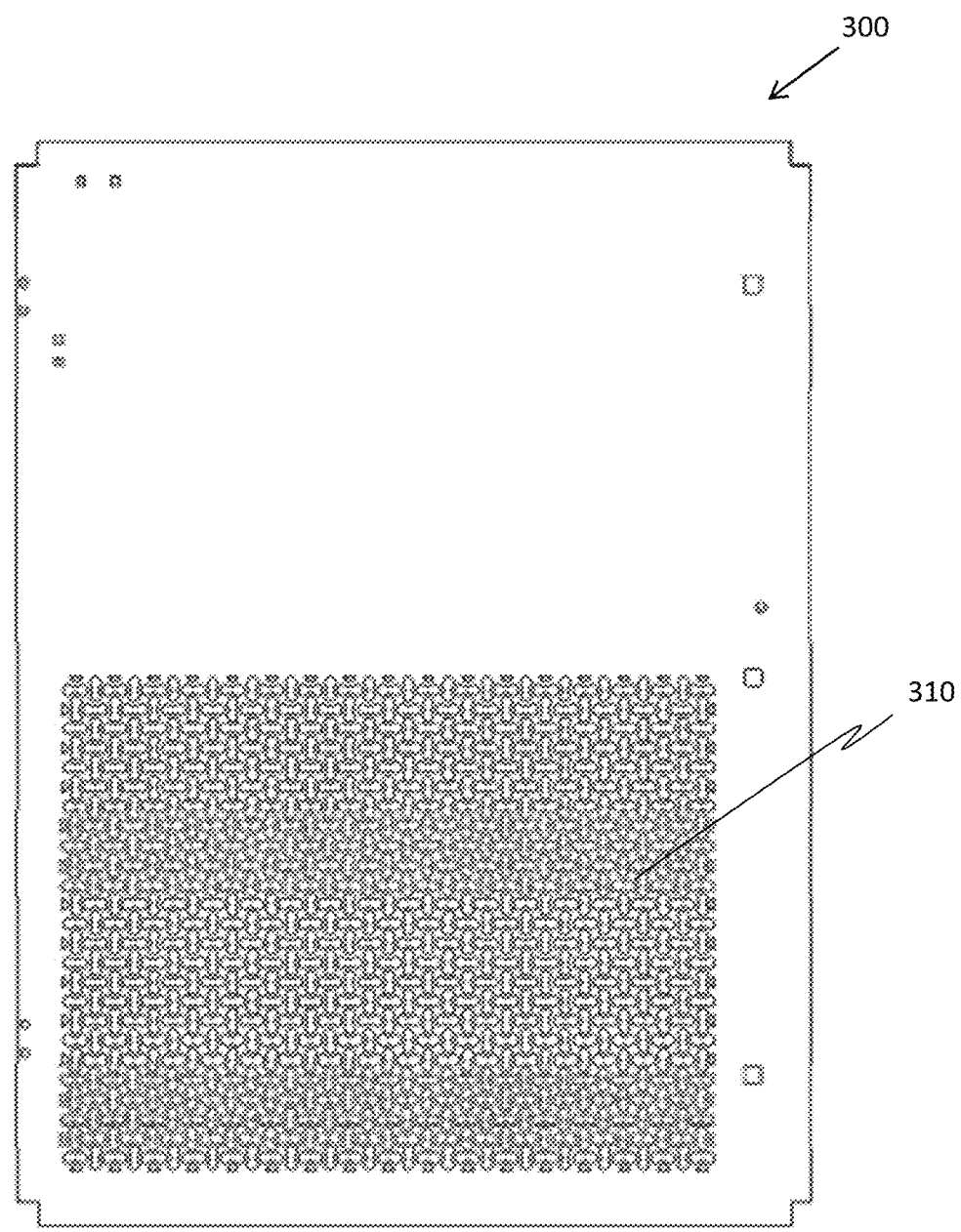
FIG. 3 illustrates a front view of one embodiment of a panel 300 for an enclosure.

FIG. 3 illustrates a front view of one embodiment of a panel 300 for an enclosure. The panel 300 is similar to panel 200 of FIG. 2, but has different geometries. In one embodiment, the panel 300 is constructed of steel. In one specific embodiment, the panel 300 is constructed of steel. In alternative embodiments, the panel is constructed of aluminum, other metal, or a polymeric material.

The panel 300 has a solid upper portion, and a grill 310 disposed in a lower portion. The grill 310 includes a plurality of rounded, elongated openings. The grill 310 accounts for about 23% of the surface of the panel 300. In alternative embodiments (not shown), the grill may account for less than 23% of the surface of the panel or more than 23% of the surface of the panel. In another alternative embodiment (not shown), the grill is disposed in a middle or upper portion of the panel. In yet another alternative embodiment (not shown), a panel includes multiple grills. For example, grills may be disposed in both an upper and a lower portion of the panel.

Figure 3A:
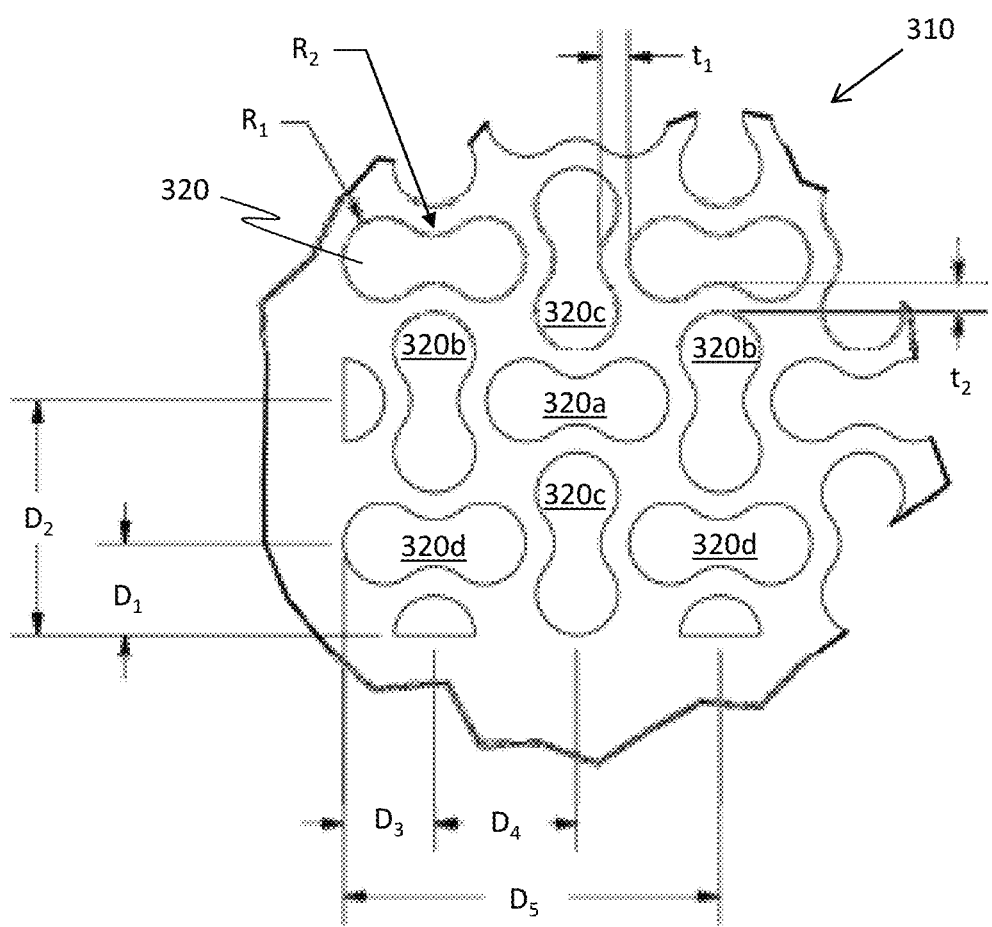
FIG. 3A illustrates a detail view of a portion of the grill of the panel 300.

FIG. 3A illustrates a detail view of a portion of the grill 310 of FIG. 3. As can be seen in this view, each opening 320 has a pair of convex rounded ends connected by a concave middle portion. Such a shape may be described as a "barbell" or "dog bone" shape. In the illustrated embodiment, each convex rounded end is defined by an arc of a circle having a radius $R_1$ that is equal to the radius $R_2$ of each concave middle portion. In one known embodiment, each radius $R_1$, $R_2$ is 0.252 inches. In alternative embodiments, any radius may be employed.

In an alternative embodiment (not shown), $R_1$ is not equal to $R_2$. In another alternative embodiment (not shown), the dog bone shape of the opening is not defined solely by a single radius, or by an arc of a circle. For example, a dog bone shape may have rounded ends defined by multiple radii or an irregular curve. As another example, a dog bone shape may have an elongated center portion that includes straight lines or curved lines that are defined by multiple radii or an irregular curve.

The openings 320 may be formed by laser cutting or by a punching process. In alternative embodiments, the openings may be formed by plasma cutting or by a water jet. In the illustrated embodiment, each opening 320 has the same dimensions. In an alternative embodiment, the size or shape of different openings may vary.

In the illustrated embodiment, the openings 320 are arranged in alternating orientations in both the horizontal and vertical directions. However, it should be understood that the terms "horizontal" and "vertical" are merely used for convenience in this specification, and the openings may be disposed at any angle. Put another way, a first opening 320a is arranged in a first orientation. The first opening 320a is horizontally flanked by a pair of second openings 320b. Each of the second openings 320b has the same second orientation, wherein the second orientation is different from the first orientation. Additionally, the first opening 320a is vertically flanked by a pair of third openings 320c. Each of the third openings 320c also has the same second orientation as the second openings 320b. In the illustrated embodiment, the first orientation is 90° different from the second orientation, such that the first opening 320a extends in a horizontal direction and the adjacent second and third openings 320b, 320c extend in a vertical direction.

In this arrangement, the convex ends of the first opening 320a are adjacent to the concave middle portions of the second openings 320b. Additionally, the concave middle portions of the first opening 320a are adjacent to the convex ends of the third openings 320c. The grill pattern may therefore be described as having interlocking openings. Arranging the openings in this manner minimizes the thickness of the material between the openings. In the illustrated embodiment, the thickness $t_1$ between horizontally adjacent openings is equal to the thickness t2 between vertically adjacent openings. In one known embodiment, the panel 300 is constructed of 11-gauge steel (i.e. steel having a thickness of about 0.125 inches) and the material thickness $t_1$, $t_2$ between openings is 0.175 inches. In alternative embodiments, the material thickness between openings is at least equal to the thickness of the panel. In other alternative embodiments, any material thickness between openings may be employed.

It should be understood that other alternating patterns may be employed. For example, the orientation of adjacent openings may be rotated by 30°, 45°, or 60°. In other embodiments, any rotation may be employed. In an alternative embodiment (not shown), each opening has the same orientation, but the openings are offset to reduce the thickness of the material between the openings.

In the illustrated embodiment, a first distance $D_1$ represents a distance from a bottom of a vertically oriented opening (e.g., third opening 320c) to the mid-point of the same opening. The first distance $D_1$ also represents the distance from a bottom of a vertically oriented opening to the mid-point of a horizontally adjacent opening (e.g., fourth opening 320d). A second distance $D_2$ represents a distance from a bottom of a vertically oriented opening (e.g., third opening 320c) to the mid-point of a vertically adjacent opening (e.g., first opening 320a).

Additionally, a third distance $D_3$ represents a distance from a first end of a horizontally oriented opening (e.g. fourth opening 320d) to the mid-point of the same opening. The third distance $D_3$ also represents the distance from a first end of a horizontally oriented opening to the mid-point of a vertically adjacent opening (e.g., second opening 320b). A fourth distance $D_4$ represents a distance from a mid-point of a horizontally oriented opening (e.g., fourth opening 320d) to the mid-point of a horizontally adjacent opening (e.g., third opening 320c). A fifth distance $D_5$ represents a distance from a first end of a horizontally oriented opening (e.g. fourth opening 320d) to the mid-point of the next horizontally oriented opening (e.g., the next fourth opening 320d).

In one embodiment, the first distance $D_1$ is equal to the third distance $D_3$ and the second distance $D_2$ is equal to the sum of the third distance $D_3$ and the fourth distance $D_4$. Additionally, the fifth distance $D_5$ is equal to the sum of the second distance $D_2$ and the fourth distance $D_4$. In one specific embodiment, the first distance $D_1$ and the third distance $D_3$ are each 0.56 inches, the second distance $D_2$ is 1.44 inches, the fourth distance $D_4$ is 0.881 inches, and the fifth distance $D_5$ is equal to 2.32 inches. In alternative embodiment, the distances may have different relationships or different values.

Testing has been done to compare the rounded, elongated openings of FIG. 3A to rectangular openings. In a first test, an enclosure assembly was tested with a pair of Kooltronic KBB60-60 fans and a first door. The first door had a grill with rectangular openings extending over 214.84 square inches. When the first door was used, the fans' motor operating current varied by approximately 3% from its initial setpoint.

In a second test, the same enclosure and fans were used, except the first door was replaced with a second door. The second door had a grill with rectangular openings extending over 537.10 square inches. When the second door was used, the fans' motor operating current stabilized at 0% from the initial setpoint.

In a third test, the same enclosure and fans were used, except the first door was replaced with a third door. The third door had a grill with rounded, elongated openings having the geometries shown in FIG. 3A. The rounded, elongated openings extended over 365.48 square inches. When the third door was used, the fans' motor operating current stabilized at 0% from the initial setpoint. Thus, the use of 365.48 square inches of the rounded, elongated openings was as effective as the use of 537.10 square inches of the rectangular openings. In other words, the surface area of the grill of the third door is more than 30% smaller than the surface area of the grill of the second door, and the surface area of the solid portion of the third door is correspondingly larger than the surface area of the solid portion of the second door. The third door provides more surface area for mounting devices than the second door, without losing any efficiency in cooling.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A system comprising:
an enclosure having at least one panel with a grill disposed thereon, wherein the grill includes a plurality of rounded, elongated openings, each elongated opening having a pair of convex rounded ends connected by a concave curved middle portion, the pair of convex rounded ends being defined by a first radius, the curved middle portion being defined by a second radius, the first radius being equal to the second radius, the openings being arranged to form an interlocking arrangement wherein the concave curved middle portion of an opening is adjacent the convex rounded ends of adjacent openings;
electrical equipment housed in the enclosure; and
at least one fan configured to force air over the electrical equipment and out the grill of the at least one panel.

2. The system of claim 1, wherein a material thickness between the adjacent openings is at least equal to a thickness of the at least one panel.

3. The system of claim 1, wherein the openings are arranged in alternating orientations such that a first opening extends in a first direction and a second opening adjacent to the first opening extends in a second direction different from the first direction.

4. The system of claim 1, wherein the grill includes a first opening arranged in a first orientation, wherein the first opening is flanked by a pair of second openings, each of the second openings having a second orientation.

5. The system of claim 4, wherein the second orientation is different from the first orientation.

6. The system of claim 5, wherein the first opening is flanked by a pair of third openings.

7. The system of claim 6, wherein each of the third openings has the second orientation.

8. A system comprising:
an enclosure having at least one panel with a grill disposed thereon, wherein the grill includes a plurality of rounded, elongated openings, each elongated opening having a pair of rounded ends connected by a curved middle portion, wherein each of the pair of rounded ends is defined by a single continuous curve having a first radius, the first radius having a center point located within a boundary of the elongated opening, the grill including a first opening arranged in a first orientation, the first opening being flanked by a pair of second openings, one of the pair of second openings being located at a first rounded end of the first opening and the other one of the pair of second openings being located at a second rounded end of the first opening opposite the first rounded end, each of the second openings having a second orientation that is different from the first orientation;
electrical equipment housed in the enclosure; and
at least one fan configured to force air over the electrical equipment and out the grill of the at least one panel.

9. The system of claim 8, wherein the curved middle portion is defined by a second radius, and wherein the first radius is equal to the second radius.

10. The system of claim 8, wherein a material thickness between adjacent openings is at least equal to a thickness of the at least one panel.

11. The system of claim 8, wherein the openings are arranged in alternating orientations such that a first opening extends in a first direction and a second opening adjacent to the first opening extends in a second direction different from the first direction.

12. A system comprising:
an enclosure having at least one panel with a grill disposed thereon, wherein the grill includes a plurality of rounded, elongated openings, each elongated opening having a pair of convex rounded ends connected by a curved middle portion having a first concave side opposite to a second concave side, a transition between each of the convex rounded ends and the curved middle portion being a smoothly curved surface, wherein each of the pair of convex rounded ends is defined by a first radius;
electrical equipment housed in the enclosure; and
at least one fan configured to force air over the electrical equipment and out the grill of the at least one panel.

13. The system of claim 12, wherein the curved middle portion is defined by a second radius, and wherein the first radius is equal to the second radius.

14. The system of claim 12, wherein a material thickness between adjacent openings is at least equal to a thickness of the at least one panel.

15. The system of claim 12, wherein the openings are arranged such that a first opening extends in a first direction and a second opening adjacent to the first opening extends in a second direction different from the first direction.

16. The system of claim 12, wherein the grill includes a first opening arranged in a first orientation, wherein the first opening is flanked by a pair of second openings, each of the second openings having a second orientation different from the first orientation.

\* \* \* \* \*